(12) United States Patent
Nam et al.

(10) Patent No.: US 8,846,276 B2
(45) Date of Patent: Sep. 30, 2014

(54) BLANKMASK AND PHOTOMASK USING THE SAME

(71) Applicant: S&S TECH Co., Ltd., Daegu-si (KR)

(72) Inventors: Kee-Soo Nam, Daegu-si (KR);
Geung-Won Kang, Daegu-si (KR);
Jong-Hwa Lee, Daegu-si (KR);
Chul-Kyu Yang, Daegu-si (KR);
Soon-Gi Kwon, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 72 days.

(21) Appl. No.: 13/653,698

(22) Filed: Oct. 17, 2012

(65) Prior Publication Data
US 2013/0095415 A1   Apr. 18, 2013

(30) Foreign Application Priority Data

Oct. 17, 2011 (KR) .................. 10-2011-0105833

(51) Int. Cl.
*G03F 1/46* (2012.01)
*G03F 1/24* (2012.01)
*G03F 1/80* (2012.01)

(52) U.S. Cl.
CPC .... *G03F 1/46* (2013.01); *G03F 1/80* (2013.01)
USPC ........................................................... 430/5

(58) Field of Classification Search
CPC ............... G03F 1/24; G03F 1/26; G03F 1/80; C23F 1/00
USPC .............. 430/5, 30, 322, 323; 378/35; 216/59
See application file for complete search history.

(56) References Cited

U.S. PATENT DOCUMENTS

2005/0238963 A1* 10/2005 Ishibashi et al. ................... 430/5
2010/0261099 A1* 10/2010 Yoshikawa et al. ............... 430/5

FOREIGN PATENT DOCUMENTS

| JP | 2010009001 A | 1/2010 |
|---|---|---|
| JP | 2011129611 A | 6/2011 |
| JP | 2011181810 A | 9/2011 |
| KR | 10-2007-0073613 A | 7/2007 |
| KR | 10-2010-0002067 A | 1/2010 |
| KR | 10-2011-0085737 A | 7/2011 |

* cited by examiner

*Primary Examiner* — Stephen Rosasco
(74) *Attorney, Agent, or Firm* — William Park & Associates Patent Ltd.

(57) ABSTRACT

Provided is a blankmask for a hardmask. In the blankmask, a hard film is formed by appropriately controlling contents of nitrogen and carbon therein to reduce a deviation in a critical dimension caused when an etch process is performed. A metal film is formed to a thin thickness by increasing a content of metal in a light-shielding film and reducing a content of metal in an anti-reflective film. Thus, resolution, pattern fidelity, and chemical resistance of the metal film may be improved. Also, the metal film and the hard film are formed such that a reflectivity contrast therebetween is high, thereby allowing the hard film to be easily inspected. Accordingly, the blank mask for a hardmask may be applied to a dynamic random access memory (DRAM), a flash memory, or a micro-processing unit (MPU) to have a half-pitch of 32 nm or less, and particularly, a critical dimension of 22 nm or less.

20 Claims, 4 Drawing Sheets

BLANKMASK AND PHOTOMASK USING THE SAME

CROSS-REFERENCE TO RELATED APPLICATION

This application claims priority to and the benefit of Korean Patent Application No. 2011-0105833, filed on 17 Oct. 2011, the disclosure of which is incorporated herein by reference in its entirety.

BACKGROUND

1. Field of the Invention

The present invention relates to a blankmask for a photomask used to manufacture a semiconductor device, a photomask, and a method of manufacturing the photomask, and more particularly, to a blankmask for a photomask, which is thin and is formed of a metal film and a hard film having different reflectivities such that a critical dimension (CD) can be measured and a defect inspected therein, and a photomask using the blankmask.

2. Discussion of Related Art

As semiconductor devices have become finer, the performances and functions thereof, e.g., high operating speeds, low power consumption, and the like, have been improved and manufacturing costs have been reduced. Thus, there is a growing need to manufacture much finer semiconductor devices. Lithography technology has been used to manufacture a fine semiconductor device. Much attention has been paid to a transfer mask for performing the lithography technology, as critical technology for manufacturing a fine semiconductor device, together with an exposure device and resist materials.

Recently, semiconductor devices of the post-45-nm-half-pitch generation have been developed. A half-pitch of 45 nm is ⅕ of 193 nm that is a wavelength of exposure light of an ArF excimer laser. To manufacture a semiconductor device of the post-45-nm-half-pitch generation, it is insufficient to use only resolution enhancement technology (RET), such as conventional phase inversion and off-axis illumination, and optical proximity correction (OPC) technology. Thus, immersion exposure lithography technology or double patterning technology is required.

When a photomask having a light-shielding film pattern formed on a transparent substrate is manufactured, a resist film having a mask pattern is used as an etch mask to perform dry etching on a metal film. Thus, the resist film is also etched and consumed, thereby lowering the resolution of the photomask. To solve this problem, the metal film should be formed as a thin film. However, in this case, optical density of the photomask decreases.

To solve this problem, there has been developed a blankmask for a hardmask, in which a molybdenum silicide (MoSi)-based metal film and a chrome-based hard film are formed on a substrate. When the chrome-based hard film is used, a load on a resist film may be reduced and a resolution of the photomask may be prevented from being reduced when a mask pattern is transcribed onto the chrome-based hard film that is a thin film. The blankmask for a hardmask is used to etch a lower thin film using a hard film formed of an inorganic material as an etch mask, instead of a conventional resist film formed of an organic material. In this case, the hard film may be thinner than the conventional resist film, thereby improving an aspect ratio and an etch selectivity with respect to a metal film that is to be etched. Thus, when the metal film is etched using the hard film as an etch mask, a loading effect according to a pattern density and the distances between patterns may be reduced, thereby improving a critical dimension (CD) mean to target (MTT), CD linearity, CD uniformity, and the like.

When the blankmask for a hardmask described above is applied to manufacturing a device having a half-pitch of 32 nm or less and particularly, a half-pitch of 22 nm or less, the following problems may occur.

First, a hard film may have poor etch characteristics.

Figure 1A:
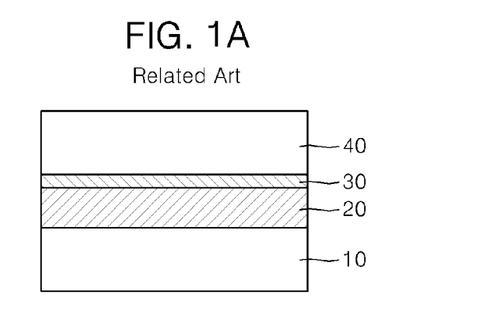
FIGS. 1A to 1D are cross-sectional views of a process of manufacturing a photomask using a conventional blankmask for a hardmask.
Figure 1B:
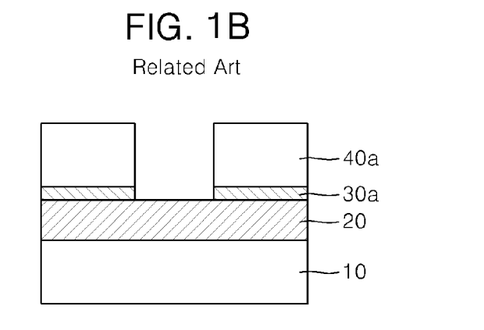
Figure 1C:
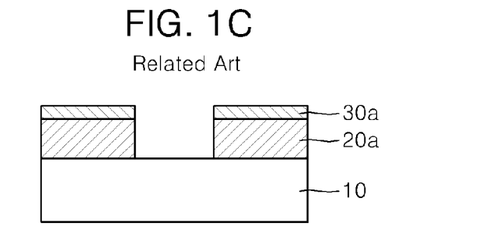
Figure 1D:
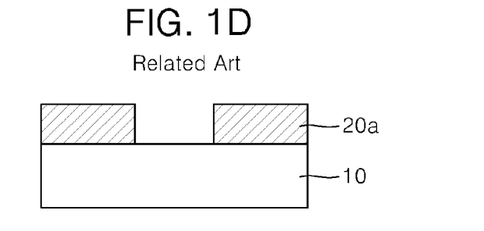

FIGS. 1A to 1D are cross-sectional views of a process of manufacturing a photomask using a conventional hard film. Referring to FIG. 1A, a blankmask in which a metal film 20, a hard film 30, and a resist film 40 are formed on a substrate 10 is formed. Then, as illustrated in FIG. 1B, the resist film 40 is patterned to form a resist pattern 40a, and an etch process is performed using the resist pattern 40a as an etch mask to form a hard film pattern 30a. Then, as illustrated in FIG. 1C, the metal film 20 is etched using the hard film pattern 30a as an etch mask to form a metal film pattern 20a. Referring to FIG. 1D, the hard film pattern 30a is removed, thereby completing the manufacture of the photomask.

However, since the hard film 30 has a thin thickness of several to several tens of, a problem, e.g. a CD bias, occurs when an etch rate of the hard film 30 is less than or greater than a desired level during an etch process. For example, if the etch rate of the hard film 30 is high, skew occurs, for example, a CD exceeds a target CD, and a CD is difficult to control. If the etch rate of the hard film 30 is too low, the thickness of the resist film 40 which is an upper film decreases and the loading effect occurs on the hard film 30. In particular, a CD of a desired device becomes finer. Accordingly, the etch characteristics of the hard film 30 are very important.

Second, resolution and pattern fidelity of a photomask are limited by the thickness of a metal film.

When a photomask is manufactured by patterning a metal film using a hard film as an etch mask to form a fine pattern having a half-pitch of 32 nm or less and particularly, a half-pitch of a 22 nm or less, the resolution and pattern fidelity of the photomask are influenced by the thickness of the metal film.

More specifically, as a half-pitch of a dynamic random access memory (DRAM) becomes fine, e.g., 45 nm or 32 nm, optical proximity correction (OPC) design for forming a fine pattern during manufacture of a photomask becomes more complex. When OPC is performed, a sub-resolution feature size (SRFS) in which a pattern is not substantially formed on a wafer according to an ×4 reduction exposure method requires a pattern of 60 nm on a photomask when a half-pitch of a DRAM is 45 nm and requires a pattern of 42 nm on the photomask when the half-pitch of the DRAM is 32 nm. If a metal film is thick, the SRFS is not precisely formed. Such a problem becomes worse when a DRAM has a half-pitch of 22 nm or less. To solve this problem, the metal film may be formed to be thin. However, the thickness of the metal film is directly related to the optical density thereof. For this reason, there are restrictions to forming the metal film to be thin.

Third, it is difficult to inspect a hard film and a metal film.

Figure 2A:
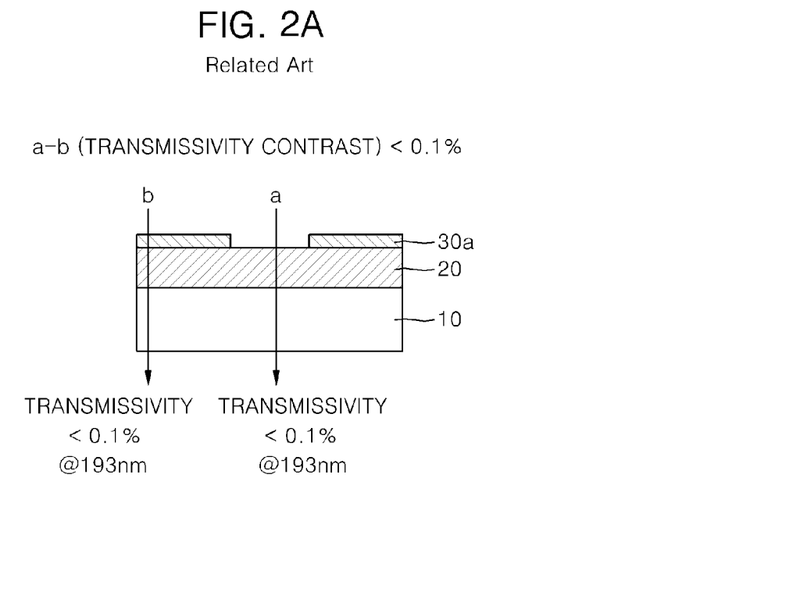
FIGS. 2A and 2B are cross-sectional views illustrating a method of inspecting a blankmask for a hardmask.
Figure 2B:
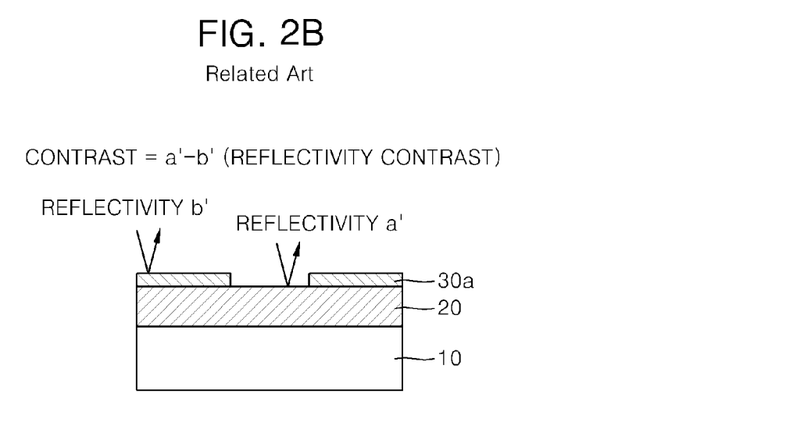

During a photomask process, an inspection of verifying processes of manufacturing a hard film and a metal film may be classified as a transmissive inspection method or a reflective inspection method as illustrated in FIGS. 2A and 2B. The method illustrated in FIG. 2A uses the difference between the transmissivity a of light passing through a metal film 20 and the transmissivity b of light passing through a hard film pattern 30a. The method illustrated in FIG. 2B uses the reflectivity a' of light from a metal film 20 and the reflectivity b' of light from a hard film pattern 30a.

In the case of the transmissive inspection method, when the hard film pattern 30a is inspected, the difference between the transmissivities of the hard film pattern 30a and the metal film 20 which is a reference layer is 0.1% or less. Thus, since the transmissivity contrast between the metal film 20 and the hard film pattern 30a is substantially zero, the hard film pattern 30a cannot be practically inspected. Thus, the reflective inspection method is indispensable to inspecting the hard film pattern 30a. However, when the metal film 20 is formed to be thin so as to solve the problems described above, the reflectivity of light from the metal film 20 increases at an inspection wavelength. In this case, when the hard film pattern 30a having a thin thickness is used, the reflectivity contrast is lowered.

SUMMARY OF THE INVENTION

Accordingly, the problems described above, i.e., a reduction in the thickness of a metal film to secure a high resolution and a deviation in a critical dimension (CD) of a hard film caused when the thickness of a metal film decreases, and difficulties in inspecting the metal film and the hard film, should be considered together, and a blankmask and a photomask should be developed in consideration of these problems.

The present invention is directed to a blankmask for a photomask, which is thin and is formed of a metal film and a hard film having different reflectivities to measure a critical dimension (CD) and inspect a defect therein, and a photomask.

According to an aspect of the present invention, there is provided a blankmask in which a metal film and a hard film are sequentially stacked on a transparent substrate. A reflectivity contrast between the metal film and hard film may be 3% to 60% at an inspection wavelength of 200 nm or less.

The reflectivity of the metal film may be lower or higher than the reflectivity of the hard film.

A ratio of the reflectivity of the metal film to the reflectivity of the hard film may be 0.7 to 1.4 at an inspection wavelength of 200 nm or less.

The hard film may have an etch rate of 0.4/sec to 1.6/sec.

The hard film may include metal, or metal and at least one selected from the group consisting of oxygen (O), nitrogen (N), and carbon (C).

The metal film may include transition metal.

The metal film may have a thickness of 200 to 600.

The metal film may have an optical density of 2.5 to 3.5 at an exposure wavelength of 200 nm or less.

An etch selectivity of the hard film with respect to a fluorine-based material for etching the metal film may be 20 or more, compared to the metal film.

The hard film may have a thickness of 20 to 200.

The metal film may be a single-layered film or a multi-layered film including two or more layers, and may be formed in the form of a single film or a continuous film.

The metal film may include a section in which a content of metal changes continuously or stepwise in a depthwise direction.

The difference between minimum and maximum contents of metal in the metal film in the depthwise direction may be 40 at % or less.

The metal film may include a light-shielding film and an anti-reflective film stacked on the transparent substrate.

A content of metal in the light-shielding film may be equal to or higher than a content of metal in the anti-reflective film.

The metal film may further include silicon and impurities, and a content of silicon may be higher than a content of the metal or a content of the impurities.

The metal film may have a reflectivity of 10% to 50% at an exposure wavelength of 200 nm or less.

The metal film may have a reflectivity of 60% or less at an inspection wavelength of 190 nm to 500 nm.

A reflectivity contrast between the metal film and the hard film may be 3% to 60% at an inspection wavelength of 193 nm.

A photomask may be manufactured using the blankmask described above.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 3:
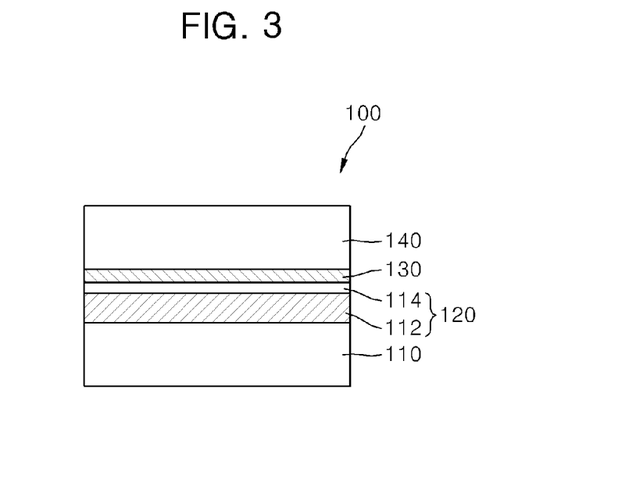
FIG. 3 is a cross-sectional view of a blankmask for a hardmask according to an embodiment of the present invention.

FIG. 3 is a cross-sectional view of a blankmask 100 for a hardmask according to an embodiment of the present invention.

Referring to FIG. 3, the blankmask 100 for a hardmask has a structure in which a transparent substrate 110, a metal film 120, a hard film 130, and a resist film 140 are sequentially stacked.

Specifically, the transparent substrate 110 has a size of 6 inches×6 inches×0.25 inches (width×height×thickness), and has a transmissivity of 90% or more at an exposure wavelength of 200 nm or less. When immersion lithography is used, a birefringence rate of the transparent substrate 110 acts as a main factor that lowers intensity and causes a deviation in a critical dimension (CD). To solve this problem, the birefringence rate of the transparent substrate 110 may be 2 nm/6.3 mm or less and more preferably, 1.5 nm/6.3 mm or less, at an exposure wavelength of 200 nm or less. Also, the transparent substrate 110 has a flatness of a total indicated reading (TIR) value of 0.5 nm or less, and has a concave shape.

The metal film 120 is formed according to a sputtering process using a target including at least one metal and silicon. The at least one metal may be a transition metal, e.g., titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), or tungsten (W). In particular, the at least one metal of the target for forming the metal film 120 may include at least one selected from the group consisting of molybdenum (Mo), tungsten (W), and tantalum (Ta). An extinction coefficient of a single metal included in the target of the sputtering process is 2.0 or more at a wavelength of 193 nm. The metal film 120 may further include impurities, e.g., at least one material among nitrogen (N), oxygen (O), and carbon (C), in addition to the at least one metal and silicon. The content of the at least one metal is higher that of the impurities, and the metal film 120 may be etched using a fluorine-based gas.

The content of the silicon contained in the target of the sputtering process to form the metal film 120 is higher than that of the at least one metal. This is because when the metal film 120 is formed of a target in which the content of silicon is lower than that of metal, transmissivity and reflectivity are changed due to a cleansing process using acid and alkaline chemicals. Thus, the content of the silicon contained in the target to form the metal film 120 may be 50 mol % or more, preferably, 70 mol % or more, and more preferably, 80 mol % or more. The target of the sputtering process to form the metal film 120 may be formed of either one target or two or more targets having different composition rates.

The metal film 120 may have a single-layered film or a multi-layered film including two or more layers, and may be formed as a single film having the same composition rate or as a continuous film, the composition rate of which changes. For example, the metal film 120 may further include a layer for controlling rear-surface reflectivity or stress. For example, if the metal film 120 has a two-storied structure, a light-shielding film 112 that mainly blocks exposure light is formed as a lower layer and an anti-reflective film 114 that reduces reflection of exposure light is formed as an upper layer, as illustrated in FIG. 3. If the metal film 120 has a multi-layered structure, the reflectivity of an outermost surface layer at an exposure wavelength may be lowest among lower layers thereof. For example, when the outermost surface layer acts as the anti-reflective film 114, a single metal film acting as the outermost surface layer may have a reflectivity of 4% to 60% and a transmissivity of 20% to 90% in a wavelength region of 190 nm to 1000 nm.

The metal film 120 has a section in which the content of metal in a depthwise direction changes continuously or stepwise. The content of metal in the metal film 120 becomes higher toward a direction of the transparent substrate 110, i.e., the depthwise direction. To secure a resolution and pattern fidelity for realizing a sub-resolution feature size (SRFS) that is an object of the present invention, the thickness of the metal film 120 should be reduced. In this respect, an experiment showed that the thickness and chemical resistance of the metal film 120 changed according to the content of metal in the metal film 120. In detail, if the content of metal was high in the metal film 120 formed of a compound of metal and silicon, then a chemical resistance, such as acid resistance and alkali resistance, was poor but an optical density at an exposure wavelength was high. Thus, when the metal film 120 is formed, the thickness of the metal film 120 may be reduced and an external chemical resistance of the metal film 120 may be maintained constant by increasing the content of metal in the metal film 120 toward the depthwise direction. In this case, the difference between minimum and maximum contents of metal in the metal film 120 may be 3 at % to 40 at %, preferably, 30 at % or less, and more preferably, 5 at % to 30 at %. When the content of metal in the metal film 120 is less than 3%, the thickness of the metal film 120 cannot actually be reduced any further. When the content of metal in the metal film 120 is greater than 40%, the external chemical resistance thereof is lowered. Also, when a sharp difference between contents of metal in the metal film 120 occurs during forming of a pattern, an etch rate of the metal film 120 changes during an etching process, thereby causing an undesired pattern profile, e.g., necking.

The content of silicon in the metal film 120 is higher than the content of metal in the metal film 120 or the content of a reactive gas used to form a film, and may optionally include a section in which a composition ratio thereof continuously changes in a depthwise direction in a plane.

The thickness of the metal film 120 may be 200 to 600 and preferably, 300 to 500. The metal film 120 cannot actually block exposure light when the thickness of the metal film 120 is less than 200, and the resolution and pattern fidelity of the metal film 120 for realizing an SRFS are low when the thickness of the metal film 120 is greater than 600.

The metal film 120 has an optical density of 2.5 to 3.5 and a superficial reflectivity of 10% to 50% at an exposure wavelength of 200 nm or less. It is actually difficult to control the reflectivity of the metal film 120 while reducing the thickness thereof. For example, in the metal film 120 including the light-shielding film 112 and the anti-reflective film 114, the anti-reflective film 114 may be formed to be thin when the thickness of the light-shielding film 112 is increased to increase an optical density of the metal film 120. However, in this case, since the anti-reflective film 114 is thin, the metal film 120 has a high reflectivity at an exposure wavelength, thus causing scattering, e.g., flare, to occur at the exposure wavelength. Thus, fine CD control is difficult to perform. When the metal film 120 has a reflectivity of less then 10%, the reflectivity contrast between the metal film 120 and the transparent substrate 110 is very low in a reflective inspective mode. In general, the reflectivity of the transparent substrate 110 formed of synthetic silica glass is 4% to 6% at a wavelength of 200 nm or less. Thus, the reflectivity contrast between the transparent substrate 110 and the light-shielding film 112 is not high in the reflective inspective mode, thereby lowering the efficiency of the inspection. Accordingly, the reflectivity of the metal film 120 may be 10 to 50% and preferably, 15% to 40% at an exposure wavelength of 200 nm or less, and particular, at an exposure wavelength of 193 nm.

Also, the metal film 120 has a superficial reflectivity of 60% or less, preferably, 45% or less, and more preferably, 40% or less, at an inspection wavelength of 190 nm to 500 nm. Any of various wavelengths, e.g., 193 nm, 257 nm, 365 nm, and 488 nm, may be used to inspect a defect in or a pattern of the metal film 120 or to perform alignment. In this case, when the reflectivity of the metal film 120 is 60% or more, scattering may occur due to the high reflectivity of the metal film 120, thereby lowering the sensitivity of the inspection.

The metal film 120 has surface roughness of 0.5 nmRMS or less. After the metal film 120 is formed, a variation in the flatness of the metal film 120 is 0.5 nm or less compared to the transparent substrate 110. The metal film 120 has a concave shape. If during forming of a pattern of the metal film 120, stress release occurs and a variation in the degree of flatness of the metal film 120 is thus 0.5 nm or more, then registration (or, misalignment) occurs due to a sharp change in the degree of flatness. Furthermore, when the shape of the metal film 120, e.g., a concave or convex shape, is contrasted with that of the transparent substrate 110, the misalignment becomes worse. Thus, a variation in the flatness of the metal film 120 after the metal film 120 is formed may be 0.5 nm or less, and preferably, 0.3 nm or less. Also, a flat shape of the metal film 120 may be same as that of the transparent substrate 110.

The hard film 130 includes at least one metallic material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W). The hard film 130 may be formed of either the at least one metallic material or the at least one metallic material and at least one material selected from the group consisting of oxygen (O), nitrogen (N), and carbon (C). The hard film 130 may be etched using a chlorine-based gas.

The hard film 130 may have a thickness of 20 to 200, have an etch selectivity of 20 or more with respect to a fluorine-based etch material used to etch the metal film 120, compared to the metal film 120. A variation in the flatness of the hard film 130 compared to that of the metal film 120 may be 0.2 nm. The hard film 130 may have a sheet resistance of 1 M$\Omega$/square or less. Also, the hard film 130 has an etch rate of 0.4/sec to 2.0/sec, and preferably, 0.6/sec to 1.6/sec. If the hard film 130 has an etch rate of 0.4 or less, the etch rate is too low and may thus prevent a desired pattern profile from being obtained. If the hard film 130 has an etch rate of 2.0/sec or more, a large deviation may occur in a CD during over-etching that is generally performed to form a pattern of the hard film 130. Specifically, controlling of an etch rate of the hard film 130 to control a deviation in the CD due to the hard film 130 is important in forming a fine pattern. This is because it is difficult to control a deviation in a CD of a fine pattern due to a thin thickness of the hard film 130 when the etch rate of the hard film 130 is high, and the resist film 140 is etched to a large extent when the etch rate of the hard film 130 is low. An evaluation of the etch rate of the hard film 130 and a deviation in a CD reveals that it is easier to control a deviation in a CD when the hard film 130 has an etch rate of 0.4/sec to 2.0/sec.

The hard film 130 shows a high reflectivity contrast relative to the metal film 120, e.g., 3% to 60% and preferably, 5% to 20%, at an inspection wavelength of 200 nm or less. In other words, the metal film 120 has a reflectivity of 0.7 to 1.4 relative to the hard film 130. Also, the hard film 130 has a reflectivity of 15% to 50% at a wavelength of 190 nm to 300 nm.

Actually, the hard film 130 only has a thickness of several to several tens of. Thus, inspecting a pattern and a defect after the hard film 130 is etched is indispensable. In particular, when a fine pattern of 22 nm to 32 nm is used, the inspection becomes more important. The inspection of a pattern and a defect may be classified into the transmissive inspection method and the reflective inspection method. Among these methods, the transmissive inspection method cannot be used since the transmissivity of the metal film 120 below the hard film 130 is low and the transmissivity contrast between the metal film 120 and the hard film 130 is thus low. Thus, the hard film 130 is inspected according to the reflective inspection method using the reflectivity contrast between the hard film 130 and the metal film 120. If the reflectivity contrast between the hard film 130 and the metal film 120 is zero, the efficiency of the inspection is low. Thus, the inspection may be efficiently performed by causing a reflectivity contrast between the hard film 130 and the metal film 120. In this case, another problem, e.g., a flare, may occur when the reflectivity of the metal film 120 is high. Thus, the reflectivity of the hard film 130 may be controlled to be high or low relative to the metal film 120. The reflectivity contrast between the hard film 130 and the metal film 120 may be 3% to 50%. If the reflectivity contrast between the hard film 130 and the metal film 120 is 3% or less, the reflectivity contrast is low and the inspection cannot be efficiently performed. If the reflectivity contrast between the hard film 130 and the metal film 120 is 60% or more, the hard film 130 is etched to a large extent. A ratio of the reflectivity of the metal film 120 relative to that of the hard film 130 may be 0.8 to 1.3 and preferably, 0.7 to 1.4. In the reflective inspection mode, absolute values of and a relative ratio of reflectivities of the metal film 120 and the hard film 130 are frequently used.

Surface treatment, e.g., thermal treatment, may be performed on the metal film 120 and the hard film 130 before, during, or after the formation thereof. The thermal treatment may be performed using at least one from among a rapid thermal process (RTP), vacuum hot-plate baking, plasma, and a furnace. During the surface treatment, all processes may be performed in a vacuum state of $10^{-3}$ torr or less. On the other hand, after the thermal treatment, cooling may be performed using natural cooling, a rapid cooling apparatus, or the like.

An organic thin film including acid ions (H+) may be optionally further formed below the resist film 140. The resist film 140 may have a thickness of 2,000 or less, and preferably, 1,500 or less.

A photomask according to an embodiment of the present invention may be manufactured by forming a pattern of the hard film 130 using the blankmask 100 for a hardmask according to an embodiment of the present invention and then patterning the light-shielding film 112 using the blankmask 100 as an etch mask. Finally, the photomask has a structure in which a pattern of the light-shielding film 112 is formed on the transparent substrate 110. The pattern of the light-shielding film 112 exhibits the properties of the light-shielding film 112 included in the blankmask 100 for a hardmask.

The present invention will now be described in greater detail with reference to exemplary embodiments thereof, but the exemplary embodiments should be considered in a descriptive sense only and not for purposes of limitation. Thus, it will be understood by those of ordinary skill in the art that various changes in form and details may be made therein. Therefore, the scope of the invention is defined not by the detailed description of the invention but by the appended claims, and all differences within the scope will be construed as being included in the present invention.

EMBODIMENTS

Design I of Metal Film (Design of Light-Shielding Film)

A metal film according to an embodiment of the present invention was formed to have a structure including two layers, but may have a structure including one layer or more than two layers. The metal film included a light-shielding film that mainly blocks light, and an anti-reflective film that is formed on the light-shielding film and reduces reflection of exposure light. The light-shielding film was designed mainly in consideration of an optical density and thickness thereof at an exposure wavelength of 200 nm or less.

A 6025-inch synthetic silica substrate, the birefringence rate of which was controlled to be 2 nm/6.3 mm or less, was used as a transparent substrate. As shown in Table 1, a metal film was formed on the transparent substrate in various shapes by changing a composition rate of molybdenum silicide (MoSi) as a target and a rate of nitrogen ($N_2$) which is a reactive gas using DC magnetron equipment, within a range in which a thickness of the metal film is reduced with process power of 0.3 to 1.6 kW. In this case, an optical density was set to 2.72 at 193 nm so as to determine a range of thickness of the metal film. The range of thickness was measured using the Cary-5000 spectrophotometer manufactured by Varian Medical Systems, Inc. and XRR equipment using X-rays.

TABLE 1

<Experiment Measuring Optical Density and Thickness of Light-Shielding Film>

| Embodiment No. | Target | Composition Rate of Target (at %) (metal:silicon) | Rate of Nitrogen (%) N2/(Ar + N2) | Thickness () | Optical Density @ 193 nm |
|---|---|---|---|---|---|
| 1 | MoSi | 10:90 | 0 | 382 | 2.72 |
| 2 | MoSi | 10:90 | 10 | 404 | 2.72 |
| 3 | MoSi | 10:90 | 20 | 422 | 2.72 |
| 4 | MoSi | 20:80 | 0 | 315 | 2.72 |
| 5 | MoSi | 20:80 | 10 | 332 | 2.72 |
| 6 | MoSi | 20:80 | 20 | 354 | 2.72 |
| 7 | MoSi | 30:70 | 0 | 272 | 2.72 |
| 8 | MoSi | 30:70 | 10 | 295 | 2.72 |
| 9 | MoSi | 30:70 | 20 | 323 | 2.72 |
| 10 | WSi | 30:70 | 10 | 225 | 2.72 |

The light-shielding film is required to be thin so as to improve resolution and pattern fidelity. To this end, in Embodiments 1 to 9, an experiment evaluating the thickness of the light-shielding film according to the composition rate of the target and the rate of nitrogen ($N_2$) revealed that the higher the rate of metal included in the target of a sputtering process, i.e., molybdenum, the lower the rate of nitrogen, and the lower the thickness of the light-shielding film at the same optical density. Additionally, as shown in Embodiment 10, the thickness of the light-shielding film was far lower when tungsten (W), an extinction coefficient of which is greater than that of molybdenum (Mo), was used.

Design II of Metal Film (Design of Anti-Reflective Film)

Based on Embodiments 1 to 10, the anti-reflective film that is thin and reduces occurrence of a flare at an exposure wavelength was formed as illustrated in Table 2. In this case, a rate of a reactive gas used was 30 to 60%, and process power was set to 0.3 to 1.6 kW.

TABLE 2

<Experiment Inspecting Anti-Reflective Film>

| Embodiment No. | Light-Shielding Film | Anti-Reflective Film Target Material | Anti-Reflective Film Composition Rate of Target (Mo:Si) at % | Final Thickness () | Optical Density @ 193 nm | Reflectivity (%) @ 193 nm |
|---|---|---|---|---|---|---|
| 11 | Embodiment 2 | MoSi | 10:90 | 595 | 2.92 to 3.05 | 17.51 |
| 12 | | MoSi | 20:80 | 583 | 2.92 to 3.05 | 18.82 |
| 13 | | MoSi | 30:70 | 575 | 2.92 to 3.05 | 20.25 |
| 14 | Embodiment 5 | MoSi | 10:90 | 470 | 2.92 to 3.05 | 17.95 |
| 15 | | MoSi | 20:80 | 453 | 2.92 to 3.05 | 22.35 |
| 16 | | MoSi | 30:70 | 448 | 2.92 to 3.05 | 24.32 |
| 17 | Embodiment 8 | MoSi | 10:90 | 398 | 2.92 to 3.05 | 17.55 |
| 18 | | MoSi | 20:80 | 382 | 2.92 to 3.05 | 25.33 |
| 19 | | MoSi | 30:70 | 368 | 2.92 to 3.05 | 28.83 |
| 20 | Embodiment 10 | WSi | 10:90 | 348 | 2.92 to 3.05 | 23.15 |
| 21 | | WSi | 20:80 | 320 | 2.92 to 3.05 | 26.32 |
| 22 | | WSi | 30:70 | 303 | 2.92 to 3.05 | 34.85 |

Based on Embodiments 11 to 22, the anti-reflective film was formed on the light-shielding film according to Embodiments 2, 5, 8, and 10. A final thickness of the metal film including the light-shielding film and the anti-reflective film was measured at 193 nm, within a range of optical density of 2.92 to 3.05. The experiment revealed that the final thickness of the metal film had a range of 550 to 600 in the case of Embodiments 11, 12, and 13, i.e., when the light-shielding film was formed using molybdenum silicide (MoSi) (Mo:Si=10:90 at %) as a target and the anti-reflective film was designed. The final thickness of the metal film had a range of 420 to 470 in the case of Embodiments 14, 15, and 16, i.e., when the light-shielding film was formed using molybdenum silicide (Mo:Si=20:80 at %) as a target and the anti-reflective film was designed. The final thickness of the metal film had a range of 360 to 400 in the case of Embodiments 17, 18, and 19, i.e., when the light-shielding film was formed using molybdenum silicide (Mo:Si=30:70 at %) as a target and the anti-reflective film was designed. The final thickness of the metal film had a range of 300 to 350 in the case of Embodiment 20, i.e., when the light-shielding film was formed using tungsten silicide (WSi) (W:Si=30:70 at %) as a target and the anti-reflective film was designed. Thus, the greater the content of metal in the light-shielding film included in the metal film, the more probable that the metal film will be formed having a desired optical density of 2.7 to 3.0 and having a thin thickness. Additionally, when tungsten, the extinction coefficient of which is higher than that of molybdenum, is used, it is more probable that the metal film will be formed having a desired optical density of 2.7 to 3.0 and having a thin thickness. Furthermore, when the anti-reflective film is formed on the light-shielding film formed of the same material used to form the anti-reflective film, the greater the content of metal in the light-shielding film, the higher the reflectivity of the metal film.

Accordingly, the experiment revealed that in order to form a metal film that is thin and the reflectivity of which is controlled to prevent occurrence of a flare, the content of metal in the light-shielding film should be high and the content of metal in the anti-reflective film should be low.

Design III of Metal Film (Evaluation of Chemical Resistance)

During manufacture of a photomask, a cleansing process is repeatedly performed on the metal film. Thus, it is important that the metal film have chemical resistance to chemicals, e.g., an SPM and a standard clean-1 (SC-1). Accordingly, the metal film was immersed in an SPM consisting of sulfuric acid at 90° C. and oxygenated water in a ratio of 10:1, and an SC-1 consisting of an ammonia solution, oxygenated water, and deionized water in a ratio of 1:1:5, for two hours and a change in the thickness of the metal film was then evaluated using the XRR equipment.

Additionally, a chemical resistance test was carried out by performing surface thermal treatment on the metal film using a rapid thermal process (RTP) device at 350° C. for thirty minutes, under a vacuum condition of 10 mtorr to 2 mtorr.

TABLE 3

<Experiment of Chemical Resistance Test>

| Embodiment No. | Previous Embodiment | SPM | SPM after RTP | SC-1 | SC-1 after RTP |
|---|---|---|---|---|---|
| 23 | 11 | 1.5 | 0.3 | 11.5 | 1.2 |
| 24 | 13 | 4.5 | 2.5 | 48.3 | 22.8 |
| 25 | 14 | 1.2 | 0.2 | 12.5 | 1.5 |
| 26 | 16 | 3.5 | 2.3 | 52.8 | 24.8 |
| 27 | 17 | 1.3 | 0.4 | 12.6 | 1.8 |
| 28 | 19 | 3.5 | 2.6 | 85.1 | 25.6 |
| 29 | 20 | 1.8 | 0.9 | 11.3 | 1.4 |
| 30 | 22 | 3.3 | 2.5 | 82.2 | 28.2 |

Thickness Variation (nm) Before-After

Referring to Embodiments 23 to 30, when the surface thermal treatment was performed using the RTP, the chemical resistance of the metal film was improved. However, referring to Embodiments 13, 16, 19, and 22, the greater the content of metal in the anti-reflective film, the poorer the chemical resistance of the metal film. This seems to be because molybdenum is weak to alkalinity and acidity.

As described above, an experiment for obtaining a metal film that is thin, the reflectivity of which is controlled to be 30% or less, and that has fine chemical resistance revealed that the content of metal in the light-shielding film included in the metal film should be high and the content of metal in the anti-reflective film included in the metal film should be low.

Design I of Hard Film

In an experiment for reducing a deviation in a CD of a hard film, dry etch rates of Cr, CrN, CrC, CrON, CrCO, and CrCON which are various examples of the hard film were compared using a chromium material and a chlorine-based reactive gas so as to evaluate etching characteristics of the hard films. In this case, the thickness of each of the hard films was controlled to be 40, an end point of etching was checked through end point detection (EPD), and process power was set to 0.3 to 1.6 kW.

TABLE 4

<Evaluation of Etching Characteristics of Hard Film>

| Embodiment No. | Material | Reactive Gas Ratio (%) | Etch Rate (/sec) |
|---|---|---|---|
| 31 | Cr | 0 | 1.20 |
| 32 | CrN | 30 | 1.56 |
| 33 | CrN | 50 | 1.90 |
| 34 | CrC | 30 | 0.41 |
| 35 | CrC | 50 | 0.35 |
| 36 | CrON | 30 | 1.12 |
| 37 | CrON | 50 | 1.35 |
| 38 | CrCO | 30 | 0.37 |
| 39 | CrCO | 50 | 0.32 |
| 40 | CrCON | 30 | 0.72 |
| 41 | CrCON | 50 | 0.93 |

Referring to Embodiments 31 to 41, the etch rate of the hard film formed of chromium was 1.20/sec. Also, the greater the content of nitrogen in the hard film, the higher the etch rate of the hard film, whereas the greater the content of carbon in the hard film, the lower the etch rate of the hard film.

A result of generalizing a deviation in a CD and a loading effect according to an etch rate of the hard film showed that the higher the etch rate of the hard film, the higher the deviation in the CD relative to the loading effect. This seems to be because the hard film had a thin thickness of 40 to increase the deviation in the CD relative to the loading effect. In this case, it was determined to be proper when the etch rate of the hard film ranges from 0.4/sec to 2.0/sec within allowable limits of error in a fine pattern.

Design II of Hard Film (Evaluation of Reflectivity Contrast)

To inspect the hard film, thermal treatment was performed on the metal films according to Embodiments 22, 23, 25, 27, and 29, a hard film was formed to a thickness of 40 on the thermally treated metal films, and the reflectivities of the hard film and the metal film were measured at 193 nm using the Cary-5000 spectrophotometer, as shown in Table 5.

TABLE 5

<Difference between Reflectivities of Hard Film and Metal Film>

| Embodiment No. | Metal Film Embodiment No. | Reflectivity (%) of Metal Film | Reflectivity (%) of Hardmask Film | Reflectivity Contrast (%) (Hard Film − Metal Film) | Reflectivity Contrast (%) (Hard Film/ Metal Film) |
|---|---|---|---|---|---|
| 42 | 22 | 34.85 | 33.55 | −1.03 | 0.96 |
| 43 | 23 | 17.51 | 31.23 | 13.72 | 1.78 |
| 44 | 25 | 17.95 | 28.12 | 10.17 | 1.57 |
| 45 | 27 | 17.55 | 27.53 | 9.98 | 1.57 |
| 46 | 29 | 23.15 | 29.43 | 6.28 | 1.27 |

Figure 4:
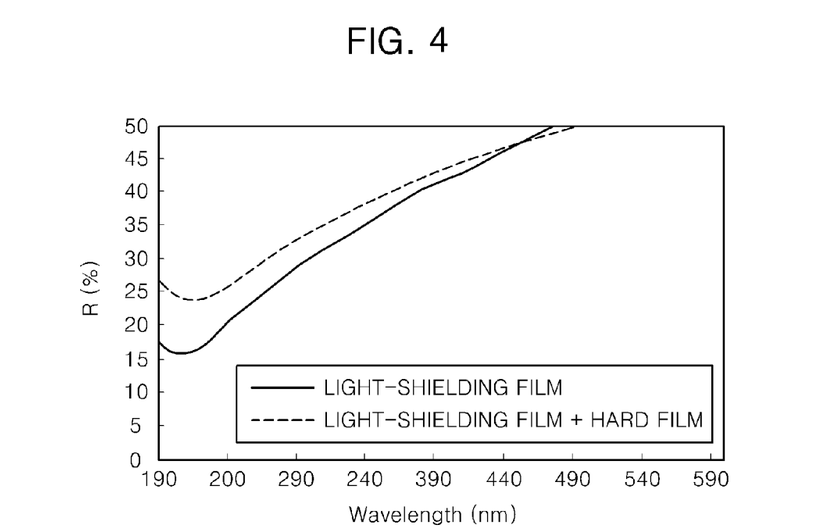
FIGS. 4 to 6 are graphs illustrating the reflectivities of a metal film and a hard film included in a blankmask for a hardmask, according to embodiments of the present invention.

Referring to Table 5, in Embodiments 43 to 46, the difference between absolute values of the reflectivities of the hard film and metal film ranges from 6% to 13%. FIG. 4 is a graph comparing the reflectivity of the metal film with that of the hard film according to Embodiment 45. Referring to FIG. 4, the difference between absolute values of the reflectivities of the hard film and the metal film is 9.98%, and a ratio of the reflectivity of the hard film to that of the metal film is 1.2 or more. Thus, during a reflective mode test of the hard film, the hard film showed a sufficient reflectivity contrast.

Also, when an absolute value of the reflectivity of the metal film according to Embodiment 42, i.e., the metal film having a reflectivity of 34.85% at 193 nm, and an absolute value of the reflectivity of a hard film were compared, the reflectivity of the hard film was 33.55%, the absolute value of the reflectivity of the hard film was 1.30%, and a ratio of the reflectivity of the hard film to that of the metal film was 0.96. Thus, a reflectivity contrast is present between the hard film and the metal film.

Figure 5:
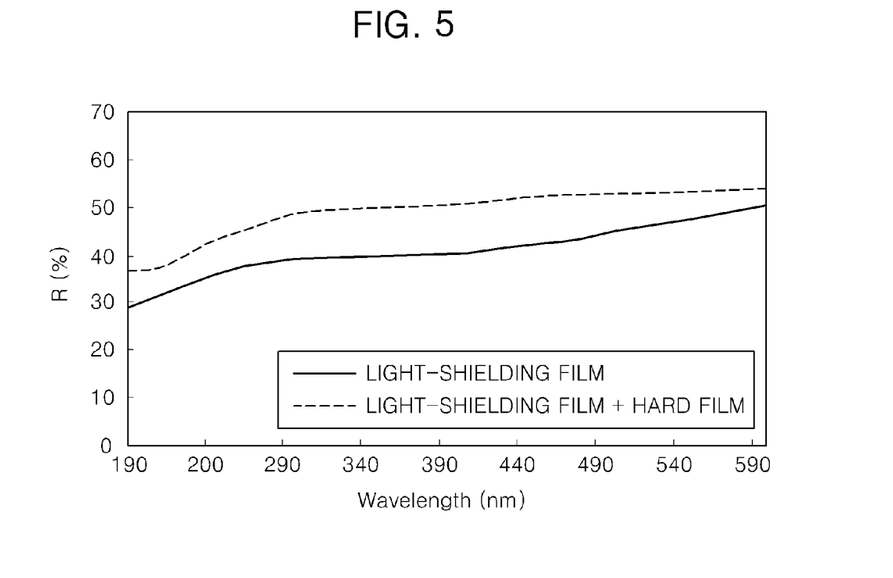
Figure 6:
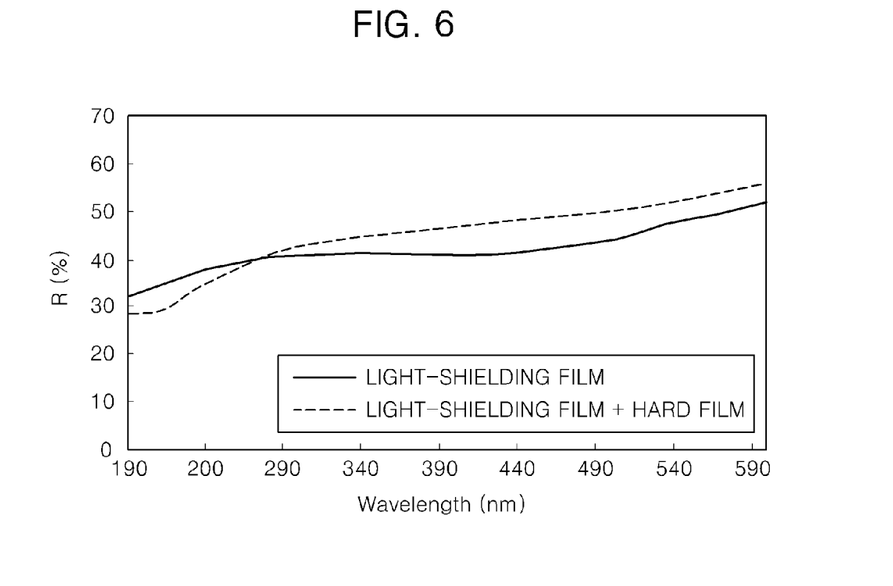

Additionally, a reflectivity contrast due to the hard film will now be described in greater detail with reference to FIGS. 5 and 6.

The light-shielding film was sputtered using molybdenum silicon (MoSi) (Mo:Si=20:80 at %) as a target and controlling the content of nitrogen to be 20%, based on the embodiments described above. In this case, as illustrated in FIG. 5, the reflectivity of the light-shielding film at 193 nm (indicated with a solid line) was 30%. Then, the hard film was formed of chromium having a thickness of 4 nm. The reflectivity of the hard film (indicated with a dotted line) was 37% at 193 nm. Accordingly, as illustrated in FIG. 5, the reflectivity contrast between surfaces of the light-shielding film and the hard film was 7%. Thus, it is easy to inspect the hard film.

Also, the light-shielding film was formed using molybdenum silicon (MoSi) (Mo:Si=15:85 at %) as a target and controlling the content of nitrogen to be 30%. In this case, as illustrated in FIG. 6, the light-shielding film had a thickness of 45 nm, an optical density of 3.0 at 193 nm, and a reflectivity of 32% (indicated with a solid line). Then, the hard film was formed of chromium nitride (CrN) having a thickness of 4 nm, and a reflectivity of the hard film (indicated with a dotted line) was measured. As a result, the hard film has a reflectivity of 28% at 193 nm.

As described above, according to an embodiment of the present invention, a metal film having fine chemical resistance is formed by increasing the content of metal in a light-shielding film, reducing the content of metal in an anti-reflective film, forming the metal film to a thin thickness so as to improve resolution and pattern fidelity thereof, and controlling the reflectivity of the metal film to be 30% or less. The greater the content of nitrogen in the hard film, the higher the etch rate of the hard film, and the greater the content of carbon in the hard film, the lower the etch rate of the hard film. Accordingly, a hard film and a metal film that are easy to inspect may be designed by appropriately controlling the etch rate of the hard film so as to reduce a deviation in a CD.

According to the above embodiments, a hard film is formed by appropriately controlling the contents of nitrogen, carbon, and oxygen therein, thereby reducing a deviation in a CD, caused when an etch process is performed.

Also, since a metal film is formed to include a light-shielding film having a high content of metal therein and an anti-reflective film having a low content of metal therein, the thickness of the metal film may be reduced to improve resolution, pattern fidelity, and chemical resistance thereof.

Furthermore, a metal film and a hard film are formed such that a reflectivity contrast therebetween is high, thereby allowing the hard film to be easily inspected.

Accordingly, a blankmask for a hardmask according to an embodiment of the present invention may be applied to a dynamic random access memory (DRAM), a flash memory, or a micro-processing unit (MPU) to have a half-pitch of 32 nm or less, and particularly, a minimum critical dimension of 22 nm or less.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A blankmask in which a metal film utilized to reflect an exposure light for pattern transfer and a hard film are sequentially stacked on a transparent substrate, wherein a reflectivity contrast between the metal film and the hard film is 5% to 20% at an inspection wavelength of 200 nm or less.

2. The blankmask of claim 1, wherein a reflectivity of the metal film is lower or higher than a reflectivity of the hard film.

3. The blankmask of claim 1, wherein a ratio of a reflectivity of the metal film to a reflectivity of the hard film is 0.7 to 1.4 at an inspection wavelength of 200 nm or less.

4. The blankmask of claim 1, wherein the hard film has an etch rate of 0.4 Å/sec to 1.6 Å/sec.

5. The blankmask of claim 1, wherein the hard film comprises at least one metal material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), wherein the hard film further comprises at least one material selected from the group consisting of nitrogen (N), oxygen (O), and carbon (C).

6. The blankmask of claim 1, wherein an etch selectivity of the hard film with respect to a fluorine-based material for etching the metal film is 20 or more, compared to the metal film.

7. The blankmask of claim 1, wherein the hard film has a thickness of 20 Å to 200 Å.

8. The blankmask of claim 1, wherein the metal film has a thickness of 200 Å to 600 Å.

9. The blankmask of claim 1, wherein the metal film has an optical density of 2.5 to 3.5 at an exposure wavelength of 200 nm or less.

10. The blankmask of claim 1, wherein the metal film is a single-layered film or a multi-layered film including two or more layers, is formed in the form of a single film or a continuous film, and is the next layer above the transparent substrate.

11. The blankmask of claim 1, wherein the metal film comprises a section in which a content of metal changes continuously or stepwise in a depthwise direction.

12. The blankmask of claim 11, wherein the difference between minimum and maximum contents of metal in the metal film in the depthwise direction is 40 at % or less.

13. A photomask manufactured using the blankmask of claim 11.

14. The blankmask of claim 1, wherein the metal film comprises a light-shielding film and an anti-reflective film stacked on the transparent substrate.

15. The blankmask of claim 14, wherein a content of metal in the light-shielding film is higher than a content of metal in the anti-reflective film.

16. A photomask manufactured using the blankmask of claim 15.

17. The blankmask of claim 1, wherein the hard film comprises at least one metal material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), and silicon (Si), wherein the hard film further comprises impurities selected from the group consisting of nitrogen (N), oxygen (O), and carbon (C).

18. The blankmask of claim 17, wherein a content of the silicon (Si) is higher than a content of the at least one metal material or a content of the impurities.

19. The blankmask of claim 1, wherein the metal film has a reflectivity of 10% to 50% at an exposure wavelength of 200 nm or less.

20. The blankmask of claim 1, wherein the metal film has a reflectivity of 60% or less at an inspection wavelength of 190 nm to 500 nm.

* * * * *